United States Patent [19]

Takahashi et al.

[11] Patent Number: 4,889,958
[45] Date of Patent: Dec. 26, 1989

[54] BUILDING WITH ELECTROMAGNETIC SHIELD STRUCTURE FOR INDIVIDUAL FLOORS

[75] Inventors: Takeshi Takahashi; Masatake Nakamura; Yoshiji Yabana; Toshiuyki Ishikawa; Koji Nagata, all of Tokyo, Japan

[73] Assignee: Shimizu Construction Co., Ltd., Tokyo, Japan

[21] Appl. No.: 60,297

[22] Filed: Jun. 10, 1987

[51] Int. Cl.$^4$ .............................................. H05K 9/00
[52] U.S. Cl. .............................. 174/35 MS; 343/879; 340/825.72
[58] Field of Search ................... 174/35 MS; 343/841, 343/851, 878, 879, 904; 340/825.72; 333/237

[56] References Cited

U.S. PATENT DOCUMENTS

| 2,599,944 | 6/1952 | Salisbury | 174/35 MS |
| 3,721,746 | 3/1973 | Knappenberger | 174/35 MS |
| 4,613,530 | 9/1986 | Hood et al. | 174/35 MS X |
| 4,639,914 | 1/1987 | Winters | 370/110.1 |
| 4,672,658 | 6/1987 | Kavehrad | 379/63 |
| 4,755,630 | 7/1988 | Smith et al. | 174/35 MS |

FOREIGN PATENT DOCUMENTS 2419792 11/1975 Fed. Rep. of Germany ........ 174/35 MS

OTHER PUBLICATIONS

Pahlaran, "Wireless Communications for Office Information Networks", IEEE Communication Magazine, June 1985, vol. 23, No. 6, pp. 19–27.
Brown, "Radiax TM, A New Slotted Cable for Short Range Radio Communication"; IEEE Int. Conference on Communications, Seattle, Wash. U.S.A., 11–13 June 1973, pp. 52–121.

Primary Examiner—Leo P. Picard
Assistant Examiner—David A. Tone
Attorney, Agent, or Firm—Armstrong, Nikaido, Marmelstein, Kubovcik & Murray

[57] ABSTRACT

A building with an electromagnetic shield structure for individual floors uses an electromagnetic shielding material in a body of the building and in openings such as windows and doorways, and the external wall surface of the building is covered with an electromagnetic shielding layer. An electromagnetically shielded space within the building is divided into individual floors by floor partitions using an electromagnetic shielding material. Wireless communication utilizing electric waves is carried out within the building, with the same frequency band or any desired frequency band being allotted to each floor. With the above arrangement, sets of communications equipment using the same frequency band on one floor can communicate with one another without interfering with sets on another floor, even though the sets of equipment on the other floors use the same frequency band. Accordingly, by installing sets of communications equipment of a fixed frequency band irrespective of the number of floors in the building, information can be communicated freely within the building.

6 Claims, 5 Drawing Sheets

BUILDING WITH ELECTROMAGNETIC SHIELD STRUCTURE FOR INDIVIDUAL FLOORS

BACKGROUND OF THE INVENTION

This invention relates to a building having a floor-by-floor electromagnetic shield structure well-suited for application to an information network system in which an electromagnetically shielded space is divided by individual floors and electromagnetic waves are utilized within the building on a floor-by-floor basis.

In many modern buildings, information generally is communicated between the interior and the outside of the building by making joint use of information communicating equipment such as multiple electronic exchanges and computers. With the increasing value of information, diversification of user needs and increasingly individual nature thereof, the amount of information involved in such communication is growing. Under these circumstances, how to supply the necessary information rapidly and at low cost has become of prime importance. In an effort to satisfy this need, data highway-type information networks utilizing optical fiber cables or coaxial cables have been studied and proposed.

However, with a data highway system utilizing optical fiber cables or coaxial cables, the cables must be stretched throughout all parts of the building to reach the various terminals. Laying these cables requires additional time and expenses.

If electromagnetic waves are used to transmit information, laying cables is unnecessary. However, owing to the emission of electromagnetic noise waves from such a building, certain restrictions apply when electromagnetic waves are used. Another problem is that the communication system may malfunction due to electromagnetic waves from outside the building.

Accordingly, the applicant has separately proposed a building within which communication by electromagnetic waves is made possible by using electromagnetic shielding materials in the body of the building and in such building openings as windows and doorways so that the entire outer periphery of the building has an electromagnetic shield structure. However, when information is communicated by electromagnetic waves in a building of this kind and an n-channel frequency band is allotted for each floor, a frequency band of $n \times m$ channels is necessary if the building has m floors. This means that if the frequency band width of each channel is, say, 25 kHz, then the frequency band width necessary for a case where the entire interior of the building is to be designed as a single electromagnetically shielded space will be $25 \text{ kHz} \times n \times m$. Consequently, the required frequency band width (the required number of channels) increases as the number of floors and the amount of traffic increase. Problems that result are an increase in the size and scale of the communications equipment and higher costs.

SUMMARY OF THE INVENTION

An object of the present invention is to provide a building the entirety of which is provided with an electromagnetic shield structure by using electromagnetic shielding materials in the building body and at openings such as windows and doorways, wherein communication via electromagnetic waves is performed upon freely allotting a frequency band to each floor of the building.

Another object of the present invention is to divide an electromagnetically shielded space into individual floors.

Still another object of the present invention is to provide a building within which wireless communication is made possible by a small number of channels.

Yet another object of the present invention is to provide a stair hall electromagnetic shield structure that makes it possible to form an individual electromagnetically shielded space for each floor of a building.

A further object of the present invention is to provide a floor-by-floor electromagnetic shield structure in which the electromagnetic shielding performance particularly of a butting end portion between floors is improved.

According to the present invention, the foregoing objects are attained by using electromagnetic shielding materials in the building body and at openings such as windows and doorways to provide the entire periphery of the building with an electromagnetic shield structure, and using electromagnetic shielding materials also in the partitions of individual floors to divide the electromagnetically shielded space of the building into individual floors.

Since the electromagnetically shielded space of the building is divided into individual floors, the same frequency band can be used on each floor, thus enabling use of the same communications equipment. This makes multi-channel wireless communication possible with use of a small number of channels in the building as a whole. If radio interference occurs when the same frequency bands are used between adjacent floors, the interference can be avoided by using frequency bands that differ from each other. This prevents erroneous operation due to the signals used on the adjacent floors.

As for stair halls, a stairway section passing through a horizontal slab is partitioned by a partition wall and an electromagnetic wave absorber is employed in the stair hall so partitioned. As a result, electromagnetic waves which penetrate the stair hall impinge upon the wall, floor and ceiling surfaces to be absorbed by the electromagnetic wave absorber, whereby leakage of electromagnetic waves to other floors can be prevented. Attenuation can be improved by designing the structure of the stair hall interior in such a manner that partition walls or the like are provided so as to shorten the propagation distance of the electromagnetic waves.

At the butting portion of each floor, an outer wall and the end portion of a slab are electrically integrated by a slab end form steel plate when the concrete of the slab is poured. This eliminates the seams between electromagnetic shielding layers of adjacent floors. As a result, since the form also serves as an electromagnetic shielding plate, each floor can be provided with an electromagnetic shielding partition in a reliable manner through the conventional construction work of setting the form and pouring the concrete, without requiring any special additional steps.

DESCRIPTION OF THE PREFERRED EMBODIMENTS

Embodiments of the invention will now be described with reference to the drawings.

Figure 1:
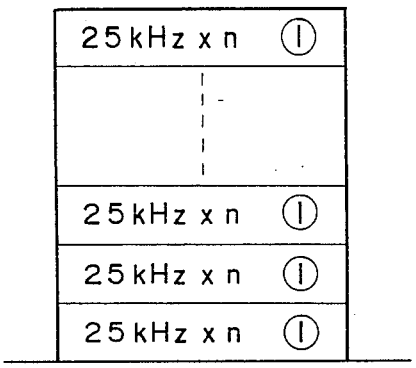
FIG. 1 is a view for describing an embodiment of a wireless communication system employed in a building with an electromagnetic shield structure for individual floors in accordance with the present invention.
Figure 2:
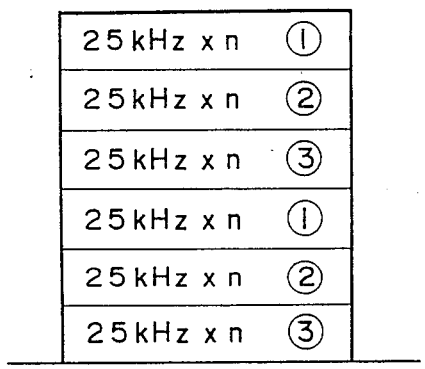
FIG. 2 is a view for describing another embodiment of a wireless communication system.

FIG. 1 is a view for describing an embodiment of a wireless communication system employed in a building with an electromagnetic shield structure for individual floors in accordance with the present invention, and FIG. 2 is a view for describing another embodiment of a wireless communication system.

In the floor-by-floor electromagnetic shield structure of the invention, a building has an electromagnetic shielding layer covering its exterior wall surface comprising the body of the building and openings such as windows and doorways, the electromagnetically shielded space within the building is divided into individual floors, frequency bands are allotted to each of the floors at will, and wireless communication is performed using electromagnetic waves having these frequency bands.

FIG. 1 illustrates an example in which the frequency band allotted to each floor is the same frequency band (1). In this case, if n channels are provided for each floor and the frequency band width of one channel is 25 kHz, then it will suffice to provide communications equipment having a frequency band width of $$25 \text{ kHz} \times n$$

on each floor. In other words, in a building with m floors, it will suffice to provide m sets of the same communications equipment. This results in lower equipment cost.

In the system shown in FIG. 1, the communications equipment can operate erroneously due to electromagnetic waves leaking from an upper or lower floor if the electromagnetic shielding at these floors is unsatisfactory. A modification of the invention for solving this problem is shown in FIG. 2, in which different frequency bands are used on mutually adjacent floors. In the illustrated example, three different frequency bands (1), (2) and (3) each having a band width of 25 kHz×n are set, and these frequency bands are allotted to individual floors of the building by repeating the mentioned order (1), (2), (3) so that no two adjacent floors share the same frequency band. Thus, since a given floor will not have the same frequency band as the floors immediately above and below, interference will not occur and the communications equipment will not operate erroneously even if there is slight leakage of radio waves from the upper and lower floors. In this case, three types of communications equipment each having a frequency band width of $$25 \text{ kHz} \times n$$

are provided and arranged so that the frequency bands used on adjacent floors differ from each other. Basically, therefore, frequency bands are allotted in such a manner that two different frequency bands are used on mutually adjacent floors.

Described next will be a specific example of an electromagnetic shield structure in which the electromagnetically shield space in a building is divided into individual floors to enable wire transmission.

Figure 3:
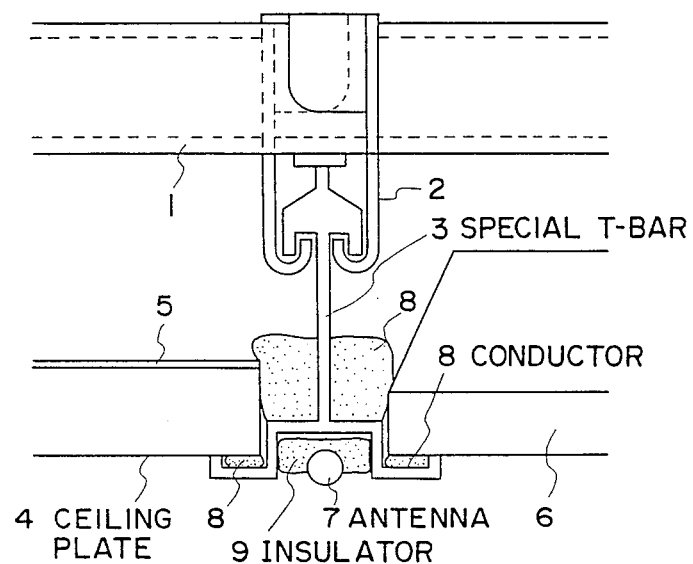
FIG. 3 is a view illustrating an example of an electromagnetically shielded ceiling system.
Figure 4:
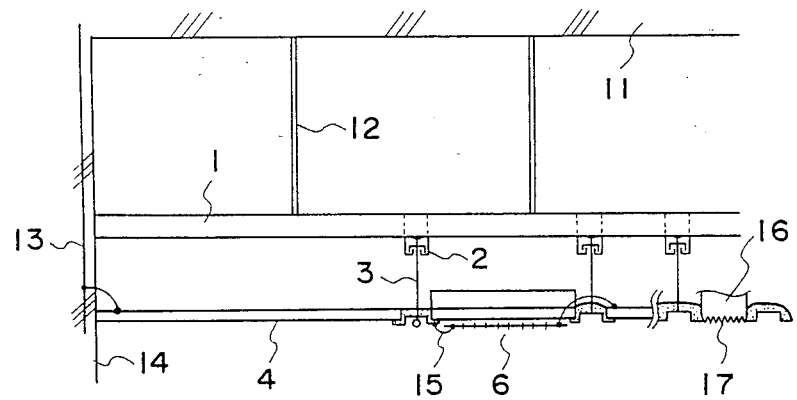
FIG. 4 is a view illustrating the overall appearance of a ceiling in which the entirety of a ceiling is designed to have an electromagnetic shield structure and an antenna is incorporated within a room.

FIG. 3 is a view illustrating one example of an electromagnetically shielded ceiling system, and FIG. 4 is a view illustrating the overall appearance of a ceiling in which the entirety of a ceiling is designed to have an electromagnetic shield structure and an antenna is incorporated within a room. Numeral 1 denotes a cradling, 2 a T-bar seat, 3 a special T-bar, 4 a ceiling plate, 5 an electromagnetic shielding material, 6 an illuminator, 7 an antenna, 8 an electrically conductive material, 9 an insulator, 11 a slab, 12 a hanging bolt, 13 a reinforcing rod, 14 a body of a building, 15 a crossover connection wire, 16 an air conditioner duct, and 17 a filter.

In FIG. 3, the cradling 1 is suspended from the slab by the hanging bolt, and the T-bar seat 2 is secured to the cradling 1 to support the special T-bar 3. As illustrated, the special T-bar 3 supports the ceiling plate 4 and illuminator 6 and makes it possible to install the antenna 7 on the inner side of a room for wireless transmission. By installing the antenna 7 on the inner side of the room via the special T-bar 3 and constructing a ceiling using the ceiling plate 4 having an electromagnetic shielding function and the illuminator 6, an electromagnetically shielded space can be divided into individual rooms in which wireless communication can be carried out. An electromagnetic shielding material 5 such as an electrically conductive film is affixed to the ceiling plate 4 and joints due to the special T-bar 3 can be electrically interconnected by using an electrically conductive material 8. The antenna 7 is insulated from the special T-bar 3 by using an insulator 9. A leakage coaxial cable or waveguide can be used as the antenna 7.

FIG. 4 shows the overall appearance of the ceiling having the antenna installed on the inner side of the room by adopting the above-described electromagnetic shield structure. As shown in FIG. 4, a louvre having an electromagnetic shielding function is used as the illuminator 6, and a mesh filter 17 is fitted into an opening of the air conditioner duct 16. The louvre and the special T-bar 3 are electrically connected by the crossover connection wire 15, whereby the louvre and T-bar are united with the ceiling plate 4. Alternatively, the special T-bar 3 and filter 17 can be electrically connected and integrated by an electrical conductor or by direct contact and grounded through the reinforcing rod 13, thereby assuring the electromagnetic shielding function of the overall ceiling surface. As a result, such devices as the stabilizer of the illuminator or other power equipment arranged on the reverse side of the ceiling are shielded from the interior of the room, so that the communications equipment within the room will not operate erroneously due to noise from these devices.

The antenna installed on the ceiling as described above is connected to a coaxial cable via a branching device and thus can be utilized in wireless communication between communications equipment arranged on each floor. A community television cable ordinarily used in buildings by being passed through a pipe shaft can be employed as the coaxial cable. A community antenna is connected to the head end of the coaxial cable, and television receivers or the like are connected to the coaxial cable via branching devices. Accordingly, a signal received from the community antenna is distributed by the branching devices via the head end and coaxial cable.

The branch devices connected to the community coaxial cable possess reverse-connection loss in order to reduce interference among one another. More specifically, signals flow between the head end and each set of equipment, but signals do not readily flow between one set of equipment and another owing to reverse-connection loss. Ordinarily, reverse-connection loss is set in accordance with the FM or television frequency band of 80 MHz or greater for community use and is effective for high frequencies of 10 MHz or more.

In a case where a transmission is made using a frequency band of the coaxial cable other than the FM or television frequency band, there will be a frequency band in which reverse-connection loss is effective, i.e. a high-frequency band of 10 MHz or more, and a frequency band in which reverse-connection loss is not effective, e.g. a low-frequency band of several MHz or less.

Accordingly, if the high-frequency band is used, it is necessary that the head end be provided with a repeater and that the transmission of information between communication controllers be carried out through the repeater. In other words, assume that a signal transmitted by a communication controller is an up-signal and that a signal received thereby is a down-signal. By using the repeater to switch the up-signal for the down-signal instead of up- and down-carrier frequencies, a single transmission line will enable communication between communication controllers.

If the low-frequency band is used, on the other hand, the repeater is unnecessary. However, a base band FSK (frequency shift keying) system is employed for signal transmission between communication controllers so that FM and television broadcasts will not be adversely affected. More specifically, when information is transmitted via a television community axial cable by "1", "0" pulses, the pulse signal contains high-frequency components, as a result of which FM and television broadcasts are adversely affected. With the base band FSK system, however, a frequency shift (FS) takes place in a frequency band of several MHz or less in accordance with the "1", "0" information, so that there are no high-frequency components detrimental to FM and television broadcasts.

FIGS. 5A through 5D are views illustrating examples of assembled plates used to provide a ceiling surface or floor surface with an electromagnetic shielding property. Numerals 21, 24 denote finishing materials, 22 a shielding material, and 23, 25, 26 electrically conductive films.

The assembled plates shown in FIG. 5 are constituted by the finishing material 21 and shielding material 22 of the same size. As shown in FIG. 5A, these are offset in two directions, stacked and joined. When the assembled plates are aligned to form a ceiling surface or floor surface, a portion of the finishing material 21 not overlapped is superimposed on the shielding material 22 of adjoining assembled plates, and a portion of the shielding material 22 not overlapped is superimposed on the finishing material 21 of adjacent assembled plates. When the assembled plates are thus arranged, electric waves leak from gaps formed between the shielding materials of mutually adjacent assembled plates. Accordingly, an electrically conductive film 23 is affixed to the surface of the finishing material 21 that contacts the shielding material 22, as shown in FIG. 5B, thereby maintaining the integrity of the electromagnetic shield.

Figure 5A:
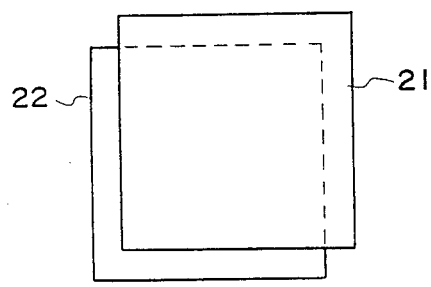
FIGS. 5A through 5D are views illustrating examples of assembled plates used to provide a ceiling surface or floor surface with an electromagnetic shielding property.
Figure 5B:
Figure 5C:
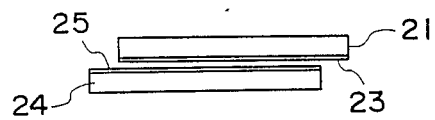
Figure 5D:
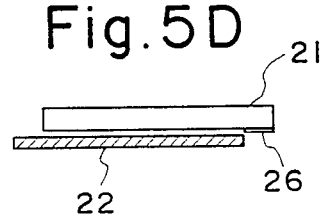

Rather than using the shielding material 5 shown in FIG. 5B, it is permissible to employ a finishing material 24, or some other member, similar to the finishing material 22, and affix an electrically conductive film 25 to the surface of the material 24 that contacts the film 23 of material 21, as shown in FIG. 5C. It is also possible to affix an electrically conductive film 26 to the surface of the finishing material 21 solely on that part thereof not overlapped by the shielding material 22, as shown in FIG. 5D.

By thus using an electromagnetic shielding material on the ceiling or floor of a building, an electromagnetically shielded space in the building can be divided into individual rooms. However, it is still necessary to provide an electromagnetic shielding effect in the stairway connecting the spaces in the individual rooms. An embodiment of an electromagnetic shielding structure for stairway will now be described.

Figure 6A:
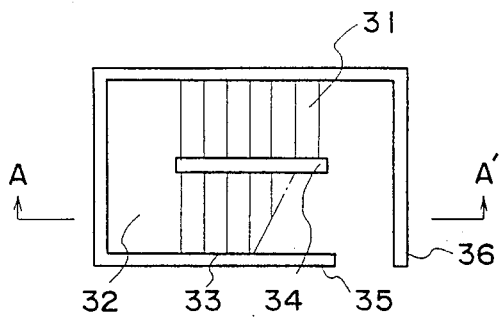
FIGS. 6A, 6B are views illustrating an embodiment of an electromagnetic shield structure for a stair hall.
Figure 6B:
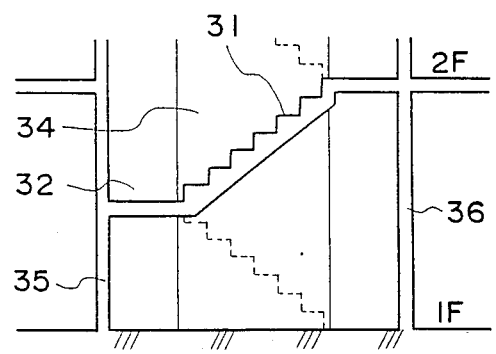
Figure 7:
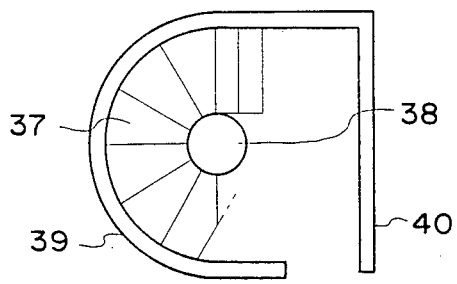
FIG. 7 is a view illustrating another embodiment of an electromagnetic shield structure for a stair hall.

FIGS. 6A, 6B are views illustrating an embodiment of an electromagnetic shielding structure for a stairway and FIG. 7 is a view illustrating another embodiment of an electromagnetic shielding structure for a stairway. In the Figures, numerals 31, 37 denote stairs, 32 a stair landing, 33 an electric wave absorber, 34 a central separating wall, 35, 36, 39 and 40 stairway hall partition walls, and 38 a cylindrical pole.

In FIG. 6, the periphery of the stairway is delimited by the partition walls 35, 36, and the central separating wall 34 is arranged at the central portion of the stairway. FIG. 6A is a plan view of this arrangement, and FIG. 6B is a sectional view taken along line A—A' of FIG. 6A. In the embodiment shown in FIG. 6, the basic structure of the staircase 31 is of the spiral staircase-type, in which the staircase ascends on both sides of the central separating wall 34 via the landing 32. The central separating wall 34 extends to the upper floor and separates the space on the side of the lower floor and the space on the side of the upper floor at the landing 32. The partition walls 35, 36 and the central separating wall 34 are provided with an electromagnetic shielding property and the wall surfaces of these walls are furnished with the electric wave absorber 33. As a result, electric waves which penetrate the stairway from each floor travel through the hall space and leak to other floors while being reflected at the wall surfaces of the stairway However, electric wave leakage is eliminated between the upper and lower floors since the electric waves are attenuated by the electric wave absorber on the wall surfaces of the partition walls 35, 36 and central separating wall 34.

FIG. 7 illustrates an example in which the staircase is a true spiral staircase with the cylindrical pole 38 arranged at its center. The pole 38 and the partitioning walls 39, 40 are provided with an electromagnetic shielding property and the wall surfaces of the walls 39, 40 as well as the floor and ceiling surfaces are furnished with the electric wave absorber. As a result, electric waves which penetrate the stairway from each floor travel through the hall space around the cylindrical pole 38 and are repeatedly reflected at the wall, floor and ceiling surfaces without leaking to the other floors. Accordingly, the electric waves can be attenuated by the electric wave absorbers on the wall surfaces of the partition walls 39, 40, pole 38 and on the staircase, floor and ceiling surfaces.

By thus using an electromagnetic shielding material such as an electrically conductive material or electric wave absorber on the floor, ceiling or walls of the stairway, an electromagnetic shielding effect can be obtained between floors with comparative ease. However, butting end portions pose a problem. More specifically, electric waves tend to leak even from small gaps at such portions and cause interference as a result. An example of a structure for electromagnetically shielding abutting end portions will now be described.

Figure 8A:
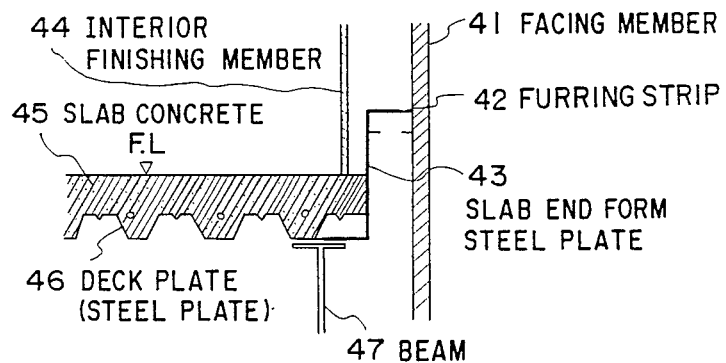
FIGS. 8A, 8B are views illustrating embodiments of a floor-by-floor electromagnetic shield structure for a floor butting portion.
Figure 8B:
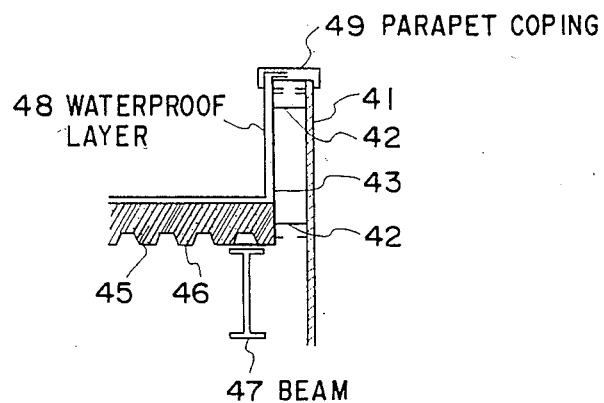

FIGS. 8A, 8B are views illustrating embodiments of a floor-by-floor electromagnetic shield structure for a floor butting portion. Numeral 41 denotes a facing member, 42 furring strips, 43 a slab end form steel plate, 44 an interior finishing member, 45 slab concrete, 46 a slab deck plate, 47 a beam, 48 a waterproof layer, and 49 parapet coping.

FIG. 8A illustrates the construction for a mid-floor, and FIG. 8B the construction for a roof. The facing member 41 has an electromagnetic shielding function obtained by being coated with e.g. an electrically conductive paint or provided with a metal mesh and attached by the furring strips 42, which are secured to the steel framework of the building body at various locations. The slab is composed of the steel slab deck plate 46 and the slab concrete 45. The slab deck plate 46 is placed on the beam 47, the form steel plate 43 is arranged at the end portion of the plate 46, and the slab concrete 5 is poured. The slab end form steel plate 43 serves as both a concrete form plate and an electromagnetic shielding plate and extends from the beam 47 to the furring strips 42, thereby electrically integrating the slab deck plate 46, furring strips 42 and facing member 41. In the case of a mid-floor, the interior finishing member 44 is installed after the slab concrete 45 is poured, as shown in FIG. 8A. For the roof, the slab concrete 45 is poured, after which the waterproof layer 48 is provided thereon and the parapet coping 49 is attached.

Since the conventional slab end portion form steel plate is used only as a concrete form, a gap is formed between the slab and the facing member and allows electric waves to pass therethrough between the upper and lower floors. However, in the electromagnetic shielding structure of the present invention, use is made of the slab end form steel plate serving as both the concrete form and the electromagnetic shielding plate, thereby preventing the electric waves from escaping between the upper and lower floors. This makes it possible to achieve electromagnetically shielded subdivisions and fire-resistant subdivisions through construction work similar to that of the prior art.

The inventors have separately proposed structures for electromagnetically shielding the outer wall surface composed of a building body and having openings for windows, entrances, exits and the like. These will now be described in brief. In one approach, the body of the building is constructed of concrete incorporating an electromagnetic shielding member. For example, this can be concrete containing a mesh or concrete mixed with ferrite. In another approach, the outer wall of a building is constructed of PC panels having an imbedded mesh, the mesh in the PC panels is electrically connected to building body fastening members, and the PC panels of upper and lower floors are electrically interconnected and grounded. In still another configuration, curtain walls fabricated using electromagnetic shielding members are fixed by anchor bolts to the building body via metal fasteners, electrically conductive cushions are affixed to the side faces of the curtain walls, and mutually adjacent curtain walls are electrically integrated to form an electromagnetic shielding space.

Even if a building body has an electromagnetically shielded structure, electric waves will pass in and out of such openings as doorways and windows. Obviously, these openings are also required to be electromagnetically shielded. To this end, a revolving door or double-door can be employed. In the latter, the linear propagation property of high-frequency electromagnetic waves is utilized to attenuate the energy of the electromagnetic waves during their transit from the first door to the second door, or an interlocked arrangement is adopted in which one of the two doors is always kept closed. At a window opening, it will suffice if the glass contains electrically conductive mesh or makes use of an electrically conductive tape that also conserves energy. Adopting the above-described expedients prevents electromagnetic waves from passing in and out of the building through the doorways and windows to provide the overall building with an electromagnetically shielded structure.

Another example of an opening in the body of a building is a duct. A duct can be electromagnetically shielded by using a metal mesh in the duct filter. As for portions where gaps are formed, electromagnetic shielding can be provided by using an electrically conductive rubber packing or electrically conductive brushes. These portions can be electromagnetically shielded by any appropriate method.

The invention is not limited to the foregoing embodiments and can be modified in various ways. As should be apparent from the above-described embodiments, the structure for electromagnetically shielding a stair hall in accordance with the invention is such that electromagnetic waves which enter the stair hall are reflected at the wall surfaces, floor surface and ceiling surface, within the hall and are attenuated by the electromagnetic wave absorbers at these surfaces. Accordingly, it goes without saying that the shape of the stair hall, the arrangement of the hall entrances, as well as the shape and arrangement of the separating wall within the hall can be modified in various ways so that electromagnetic waves which enter the stair hall will be attenuated by the electromagnetic wave absorbers without leaking directly to other floors. The electromagnetic shielding effect can be improved by using electromagnetic on the staircase, floor surface and ceiling surface. Further, in the foregoing embodiments, the steel slab deck plate is used as the slab to assure an electromagnetic shielding effect. However, if the slab does not possess an electromagnetic shielding property, then the slab concrete can be coated with an electromagnetic shielding paint or provided with an affixed electrically conductive sheet to provide an electrical connection to the slab end form steel plate.

Thus, in accordance with the invention as described above, an electromagnetically shielded space is divided into individual floors so that frequency bands can be selected independently for each floor. This enables communications equipment having the required frequency band width to be provided for each floor irrespective of the number of floors in the building as a whole. Moreover, since the same frequency band can be used on each floor, it is possible to employ a plurality of communications equipment having identical specifications or which are very few in number. This enables the communications equipment to be standardized and permits equipment costs to be reduced.

Further, since the slab end form steel plate also serves as an electromagnetic shielding plate, the leakage of electric waves from between upper and lower floors and the penetration of electric waves can be readily prevented without adding new construction steps. This enhances the electromagnetic shielding effect between floors.

As many apparently widely different embodiments of the present invention can be made without departing from the spirit and scope thereof, it is to be understood that the invention is not limited to the specific embodiments thereof except as defined in the appended claims.

What we claim is:

1. A multi-floor building having an electromagnetic shield structure for individual building floors, characterized in that an electromagnetic shielding material is positioned in the exterior walls of the building, in the windows, doorways and other openings in said building exterior walls, in each floor slab between the floors of said building and in the interior of said building in the stairwells and openings between the individual floors of said building, each said floor slab having a ceiling plate having an overlapping structure with an electromagnetic shielding material at said overlapping structure and an electromagnetic shielding material covering the entirely of the ceiling structure at each floor slab integrally connected to said overlapping structure electromagnetic shielding material.

2. A building according to claim 1, characterized in that, at each floor slab, an antenna is arranged below said ceiling plate.

3. A building according to claim 2, characterized in that, at each floor slab, a stairway passing through said floor slab is partitioned by a partition wall, and an electromagnetic wave absorber is positioned within said partitioned stair wall, the entrance to each said stairway being arranged in such manner that electromagnetic waves will not pass directly between the entrances to the stairway of upper and lower floors.

4. A building according to claim 2, characterized in that frequency bands that differ from each other are used on adjacent floors.

5. A multi-floor building having an electromagnetic shield structure for individual building floors, characterized in that an electromagnetic shielding material is positioned in the exterior walls of the building, in the windows, doorways and other openings in said building exterior walls, in each floor slab between the floors of said building and in the interior of said building in the stairwells and openings between the individual floors of said building, at each floor slab, a stairway passing through said floor slab is partitioned by a partition wall, and an electromagnetic wave absorber is positioned within said partitioned stair wall, said stairway having a central separating wall and a spiral staircase.

6. A building according to claim 5, characterized in that, at each floor a slab is provided having an electromagnetic shielding property, the external wall and slab end portion being electrically integrated by an end form steel plate when concrete of the slab is poured.

* * * * *